(12) United States Patent
Aoshima et al.

(10) Patent No.: US 6,249,407 B1
(45) Date of Patent: Jun. 19, 2001

(54) MAGNETORESISTIVE DEVICE HAVING A TANTALUM LAYER CONNECTED TO A SHIELDING LAYER VIA A LAYER OF A BODY-CENTERED CUBIC STRUCTURE

(75) Inventors: Kenichi Aoshima; Kenji Noma, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/411,354

(22) Filed: Oct. 1, 1999

(30) Foreign Application Priority Data

Feb. 5, 1999 (JP) .................................................. 11-029236

(51) Int. Cl.⁷ ....................................................... G11B 5/39
(52) U.S. Cl. ........................................................... 360/324.2
(58) Field of Search ............................... 360/324.2, 324.1, 360/324.11, 324.12, 324

(56) References Cited

U.S. PATENT DOCUMENTS

| | | |
|---|---|---|
| 5,159,513 | 10/1992 | Dieny et al. . |
| 5,390,061 * | 2/1995 | Nakatani et al. . |
| 5,862,022 * | 1/1999 | Noguchi et al. . |

FOREIGN PATENT DOCUMENTS

| | | |
|---|---|---|
| 5-151533 | 6/1993 | (JP) . |
| 9-288807 | 11/1997 | (JP) . |

* cited by examiner

*Primary Examiner*—Craig A. Renner
(74) *Attorney, Agent, or Firm*—Greer, Burns & Crain, Ltd.

(57) ABSTRACT

In a current perpendicular type magnetoresistive device, a current efficiently flows in a direction perpendicular to a plane of an MR element and the sensitivity of the MR element is increased. Upper and lower shielding layers form a gap therebetween so that the MR element is situated within the gap. Upper and lower gap layers are provided within the gap so that the MR element is interposed between the upper and lower gap layers. The upper gap layer is provided between the upper shielding layer and the MR element. The lower gap layer is provided between the lower shielding layer and the MR element. The lower gap layer is formed from tantalum. An under layer formed from a material having a body-centered cubic structure is interposed between the lower shielding layer and the lower gap layer.

13 Claims, 5 Drawing Sheets

MAGNET CHARACTERISTIC OF $CoPt-SiO_2$

MAGNETORESISTIVE DEVICE HAVING A TANTALUM LAYER CONNECTED TO A SHIELDING LAYER VIA A LAYER OF A BODY-CENTERED CUBIC STRUCTURE

BACKGROUND OF THE INVENTION

1. Field of the Invention

The present invention generally relates to a magnetoresistive device having a magnetoresistive element (MR element) and, more particularly, to a thin-film magnetoresistive device having an MR element through which a current flows in a direction perpendicular to a plane of the MR element.

2. Description of the Related Art

Figure 1:
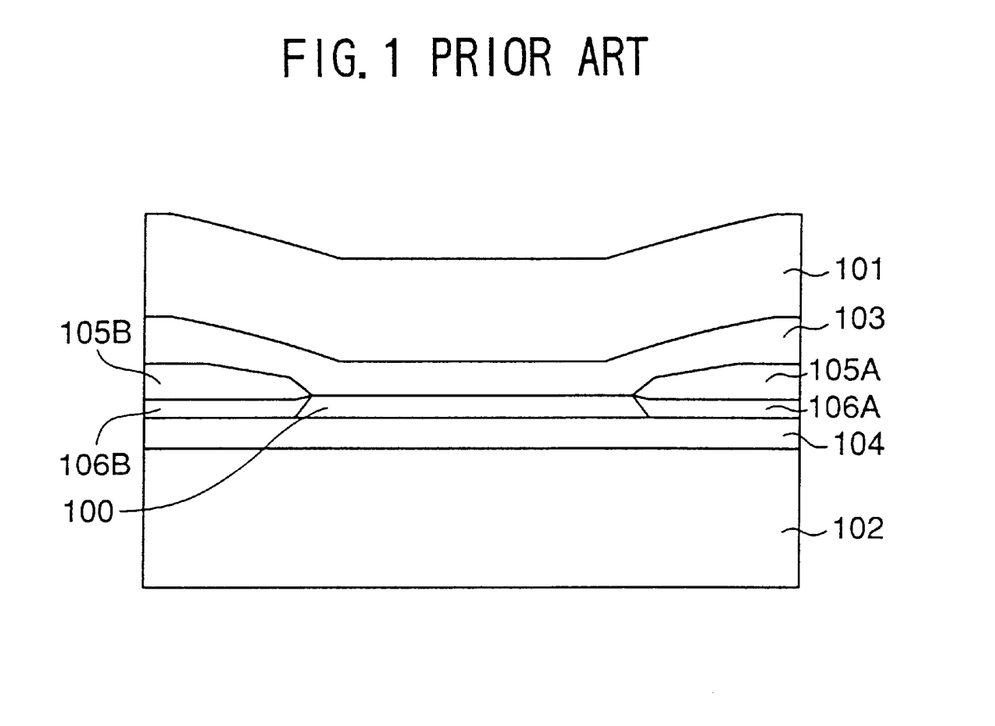
FIG. 1 is an illustration of a conventional thin-film magnetic head having an MR element.

FIG. 1 is an illustration of a conventional magnetic reproducing head formed as a thin-film device having an MR element, viewed from a side of a magnetic recording medium from which information is read by the magnetic reproducing head. In FIG. 1, a side-to-side direction corresponds to the direction of width of a track formed on the magnetic recording medium.

The magnetic reproducing head shown in

FIG. 1 comprises an MR element 100, an upper shielding layer 101, a lower shielding layer 102, an upper gap layer 103 and a lower gap layer 104. The MR element 100 is interposed between the lower gap layer 104 and the upper gap layer 103. The upper shielding layer 101 is formed on a surface of the upper gap layer 103 which surface is opposite to the MR element 100, and the lower shielding layer 102 is formed on a surface of the lower gap layer 104 which surface is opposite to the MR element 100. Each of the upper shielding layer 101 and the lower shielding layers 102 is formed from a soft magnetic material such as NiFe. Each of the upper gap layer 103 and the lower gap layer 104 is formed from an insulating material such as alumina (aluminum oxide).

Additionally, lead wires 105A and 105B are provided on the left side and the right side of the MR element 100, respectively, so as to electrically detect a change in a magnetoresistance of the MR element 100. Further, hard magnet layers 106A and 106B are formed between the lower gap layer 104 and each of the lead wires 105A and 105B, respectively. Each of the hard magnet layers 106A and 106B is formed from a material such as CoPt which has hard magnetic properties so as to eliminate a Balkhausen noise.

In the above-mentioned magnetic reproducing head, a change in the magnetoresistance of the MR element 100 can be sensed as a change in a voltage across the MR element 100 by providing a current flowing between the lead wires 105A and 105B connected to the MR element 100. Accordingly, when the magnetic reproducing head (magnetoresistive device) is positioned close to a magnetic recording medium such as a hard disk, a change occurs in the magnetoresistance of the MR element 100 in the magnetoresistive device due to a change in an electric field generated by the magnetic recording medium. Thus, such a change in the magnetoresistance can be sensed as a change in the voltage across the MR element 100.

It should be noted that the magnetic reproducing head shown in FIG. 1 is referred to as a current-in-plane (CIP) type thin-film magnetic head since a current flows from the lead wire 105A to the lead wire 105B along a plane of the MR element 100.

Figure 2:
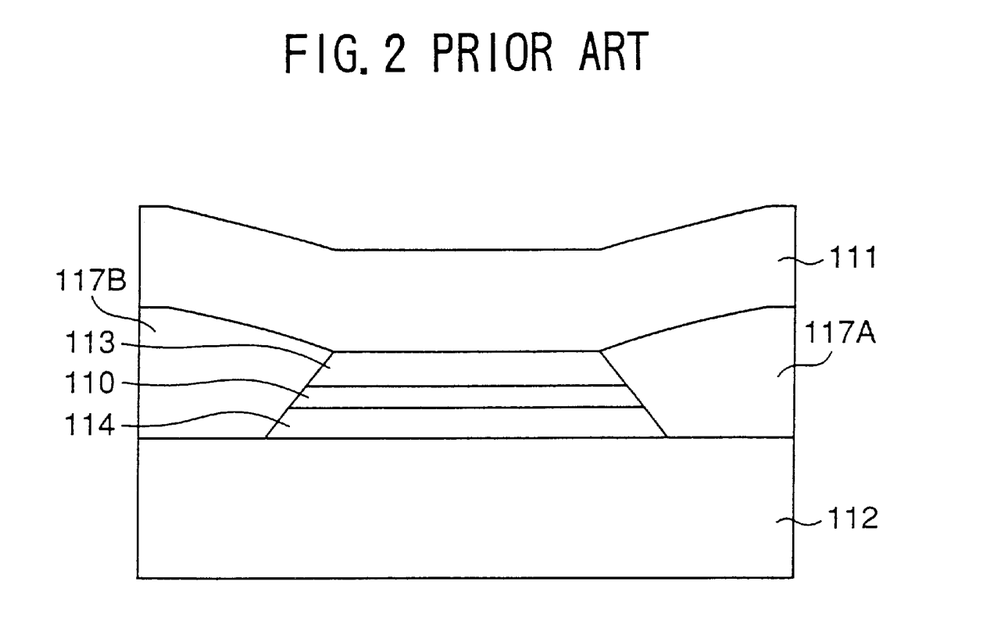
FIG. 2 is an illustration of another conventional thin-film magnetic head having an MR element.

Japanese Laid-Open Patent Application No.9-288807 discloses another thin-film magnetic head as shown in FIG. 2.

This thin-film magnetic head has a structure different from that of the thin-film head shown in FIG. 1, and is referred to as a current perpendicular (CPP) type thin-film magnetic head in which a current flows in a direction perpendicular to a plane of the MR element. That is, a current flows in a longitudinal direction in FIG. 2.

The thin-film magnetic head shown in FIG. 2 comprises an MR element 110, an upper shielding layer 111, a lower shielding layer 112, an upper gap layer 113 and a lower gap layer 114. The MR element 110 is interposed between the lower gap layer 114 and the upper gap layer 113. The upper shielding layer 111 is formed on a surface of the upper gap layer 113 which surface is opposite to the MR element 110, and the lower shielding layer 112 is formed on a surface of the lower gap layer 114 which surface is opposite to the MR element 110. Each of the upper shielding layer 111 and the lower shielding layers 112 is formed of a metallic, magnetic material having good conductivity. Each of the upper gap layer 113 and the lower gap layer 114 is formed from a conductive material such as Cu. Additionally, insulating layers 117A and 117B are provided on the left side and right side of the MR element 110, respectively, so as to fill a gap between the lower shielding layer 112 and the upper shielding layer 111. Each of the insulating layers 117A and 117B is formed from an insulating material such as alumina.

In the thin-film magnetic head shown in FIG. 2, a current flows from the upper shielding layer 111 to the upper gap layer 113, traverses the MR element 110 and finally reaches the lower shielding layer 112 via the lower gap layer 114.

In recent years, density of data recorded on a recording medium is greatly increased. In order to read the high-density data on the recording medium, a gap of the device must be reduced. Accordingly, in the conventional magnetic reproducing head shown in FIG. 1, a thickness of each of the upper and lower gap layers 103 and 104 has been reduced. However, in order to maintain sufficient insulation, the thickness of each of the upper and lower gap layers 103 and 104 must be maintained to be about 30 nm, and it is difficult to further reduce the gap.

The thin-film magnetic head shown in FIG. 1 is the CIP type in which a current flows along a plane of the MR element. Recently, a giant magnetoresistive (GMR) element has been developed. It is found that the sensitivity of the GMR element of a spin valve type can be increased by providing a current to flow in a direction perpendicular to the plane of the GMR element. However, such an attempt cannot be made to the thin-film magnetic head shown in FIG. 1 since the thin-film magnetic head shown in FIG. 1 is of the CIP type. Additionally, a tunnel type GMR element requires a current flowing in a direction perpendicular to a plane of the GMR element, and, thus, the tunnel type GMR element cannot be used in the thin-film magnetic head shown in FIG. 1.

In the CPP type thin-film magnetic head shown in FIG. 2, the gap between the shielding layers is reduced further than the CIP type thin-film magnetic head. Additionally, the CPP type thin-film magnetic head shown in FIG. 2 has a structure in which a current flows in a direction perpendicular to a plane of the MR element. However, the thin-film magnetic head shown in FIG. 2 does not satisfy the requirement to use the MR element by efficiently supplying a current in a direction perpendicular to a plane of the MR element. Additionally, the thin-film device has a problem in that a free layer of the MR element may be deteriorated by an underlayer material.

It appears that a Balkhausen noise can be reduced by applying the hard magnet layer of the thin-film device shown in FIG. 1 to the thin-film device shown in FIG. 2. However, the structure of the hard magnetic layer shown in FIG. 1 has a problem in that a yield rate is decreased due to a short-circuit between the MR element and the upper gap layer. Thus, mere application of the hard magnetic layer to the thin-film device shown in FIG. 2 cannot provide a preferred effect.

SUMMARY OF THE INVENTION

It is a general object of the present invention to provide an improved and useful magnetoresistive device in which the above-mentioned problems are eliminated.

A more specific object of the present invention is to provide a current perpendicular type magnetoresistive device in which a current efficiently flows in a direction perpendicular to a plane of an MR element and the sensitivity of the MR element is increased.

Another object of the present invention is to provide a current perpendicular type magnetoresistive device which prevents generation of a leak current while reducing a Balkhausen noise.

In order to achieve the above-mentioned objects, there is provided according to the present invention a current perpendicular type magnetoresistive device having a magnetoresistive element in which a current flows through the magnetoresistive element in a direction perpendicular to a plane of the magnetoresistive element, the magnetoresistive device comprising:

upper and lower shielding layers forming a gap therebetween so that the magnetoresistive element is situated within the gap;

upper and lower gap layers provided within the gap so that the magnetoresistive element is interposed between the upper and lower gap layers, the upper gap layer being provided between the upper shielding layer and the magnetoresistive element, the lower gap layer being provided between the lower shielding layer and the magnetoresistive element, the lower gap layer being formed from tantalum; and an under layer interposed between the lower shielding layer and the lower gap layer, the under layer being formed from a material having a body-centered cubic structure.

According to the present invention, the under layer formed from a material having a body-centered cubic structure is provided under the lower gap layer formed from tantalum on which lower gap layer the MR element is formed. In the thus-structured MR device, a current can be efficiently supplied to flow through the MR element in a direction perpendicular to a plane of the MR element, and the sensitivity of the MR element is increased. It is considered that the above-mentioned effects are obtained by low resistivity provided by the combination of the under layer formed from a material having a body-centered cubic structure and the lower gap layer formed from tantalum. Additionally, it is considered that soft magnetic properties of a free layer of the MR element are improved by the lower gap layer formed from tantalum.

In the current perpendicular type magnetoresistive device according to the present invention, the magnetoresistive element may have a predetermined width, and an insulating member may be provided on each side of the magnetoresistive element so that the insulating member covers each side of the magnetoresistive element and the insulating member spans from the upper shielding layer to the under layer, and wherein the insulating member may include an insulating layer and a hard magnet layer having hard magnetic properties so that the hard magnet layer is interposed between the insulating layer and the under layer.

According to this invention, the hard magnetic layer is provided on the under layer formed from a body-centered cubic structure on each side of the MR element. The hard magnet layer causes a soft magnetic layer of the MR element to be in a single domain state which results in a reduction of a Balkhausen noise. The hard magnet layer may be formed from a cobalt based alloy, and preferably be formed from $CoPt-SiO_2$.

Other objects, features and advantages of the present invention will become more apparent from the scope of the present invention when read in conjunction with the accompanying drawings.

DETAILED DESCRIPTION OF THE PREFERRED EMBODIMENTS

Figure 3:
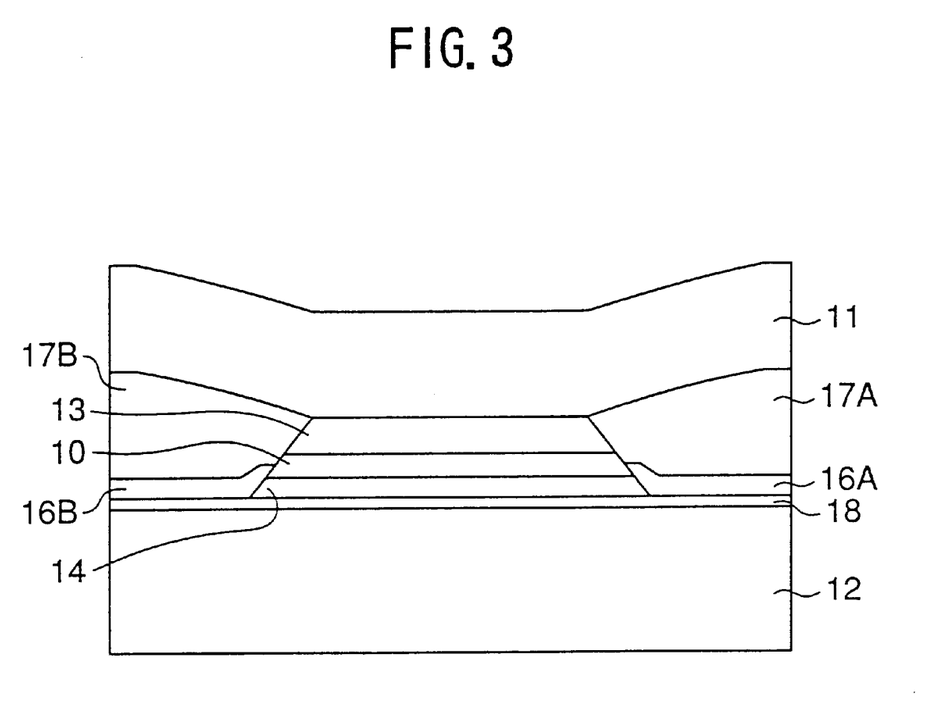
FIG. 3 is an illustration of a CPP type thin-film magnetic head according to a first embodiment of the present invention.

A description will now be given, with reference to FIG. 3, of a first embodiment of the present invention. FIG. 3 is an illustration of a CPP type thin-film magnetic head according to the first embodiment of the present invention, viewed from a side of a magnetic recording medium from which information is read by the magnetic reproducing head. In FIG. 3, a side-to-side direction corresponds to the direction of width of a track formed on the magnetic recording medium.

The magnetic reproducing head shown in FIG. 3 comprises a GMR element 10, an upper shielding layer 11, a lower shielding layer 12, an upper gap layer 13 and a lower gap layer 14. The GMR element 10 is interposed between the lower gap layer 14 and the upper gap layer 13. The upper shielding layer 11 is formed on a surface of the upper gap layer 13 which surface is opposite to the GMR element 10, and the lower shielding layer 12 is formed on a surface of the lower gap layer 14 which surface is opposite to the GMR element 10. Each of the upper shielding layer 11 and the lower shielding layers 12 is formed from a soft magnetic material such as FeZrN.

Various types of GMR elements can be used as the GMR element 10. As an example of the tunnel type GMR element, a layered structure comprising NiFe (2)/Co (1)/$Al_2O_3$ (5)/Co (2)/PdPtMn (20) is suitable. As a spin valve type GMR element, a layered structure comprising NiFe (2)/CoFeB (4)/Cu (3)/CoFeB (2.2)/PdPtMn (25)/Ta (6) is suitable. It should be noted that each number in parenthesis indicates a thickness of each layer in nanometers (nm).

The upper gap layer 13 is formed from a conductive material selected from a group consisting of copper, gold, tungsten, ruthenium, platinum, palladium and tantalum or an alloy of these metals. Preferably, a copper layer having a thickness of about 3 nm is used. The lower gap layer 14 is formed as a conductive tantalum layer having a thickness of about 20 nm.

In the thin-film magnetic head shown in FIG. 3, an under layer 18 is provided between the lower gap layer 14 and the lower shielding layer 12. The under layer 18 is formed from a material having a body-centered cubic structure such as a metal selected from a group consisting of tungsten, titanium, chrome, iron, lithium, vanadium and molybdenum or an alloy of these metals which alloy has a body-centered cubic structure. A tungsten layer having a thickness of about 10 nm is preferably used.

As appreciated from the following Table 1, a tungsten layer formed on a tantalum layer has a preferable resistivity. It should be noted that although the thickness of the Ta layer in the Table 1 is 80 nm, the same result may be obtained for a thinner Ta layer

TABLE 1

|  | under layer W | under layer none |
| --- | --- | --- |
| Ta | 80 nm | 279 nm |
| w | 10 nm | none |
| substrate | glass | glass |
| resistivity | 20.4 μΩcm | 167 μΩcm |

In FIG. 3, insulating layers 17A and 17B are provided on the right side and the left side of the GMR element 10 and between the upper shielding layer 11 and the under layer 18, respectively. Each of the insulating layers 17A and 17B is formed from an insulating material such as alumina ($Al_2O_3$). Additionally, a hard magnet layer 16A is provide between the insulating layer 17A and the under layer 18, and a hard magnet layer 16B is provided between the insulating layer 17B and the,under layer 18. The hard magnet layers 16A and 16B are provided to reduce a Balkhausen noise. Each of the hard magnet layers 16A and 16B is preferably formed from a non-conductive material having a coercive force of more than 500 Oe. When the hard magnet layers 16A and 16B are formed from such a material, a leak current can be prevented while reducing a Balkhausen noise. That is, by forming the hard magnet layer from an insulating material, short-circuiting at an edge of the MR element can be prevented, which results in an increase of a yield rate of the thin-film magnetic head.

In the above-mentioned magnetic head, each of the upper shielding layer 11 and the lower shielding layer 12 is formed of a metallic, magnetic material having good conductivity. A gap is formed between the upper shielding layer 11 and the lower shielding layer 12. The GMR element 10 is situated within the gap by being interposed between the upper gap layer 13 and the lower gap layer 14 so that the GMR element 10 is electrically connected to the upper shielding layer 11 and the lower shielding layer 12. Accordingly, a current can be supplied in a direction perpendicular to a plane of the GMR element 10. By monitoring a voltage across the GMR element by supplying a current in the direction perpendicular to a plane of the GMR element 10, a change in the magnetoresistance of the GMR element can be sensed as a change in the voltage across the GMR element 10. Thus, when the thin-film magnetic head is positioned close to the a magnetic recording medium such as a hard disk, a change occurs in the magnetoresistance of the GMR element 10 due to a change in a magnetic field generated by the magnetic recording medium, and, thereby, the change in the magnetoresistance can be read as a change in the voltage across the GMR element 10.

A description will now be given, with reference to FIGS. 4A to 4F, of a method of manufacturing the thin-film magnetic head shown in FIG. 3.

Figure 4A:
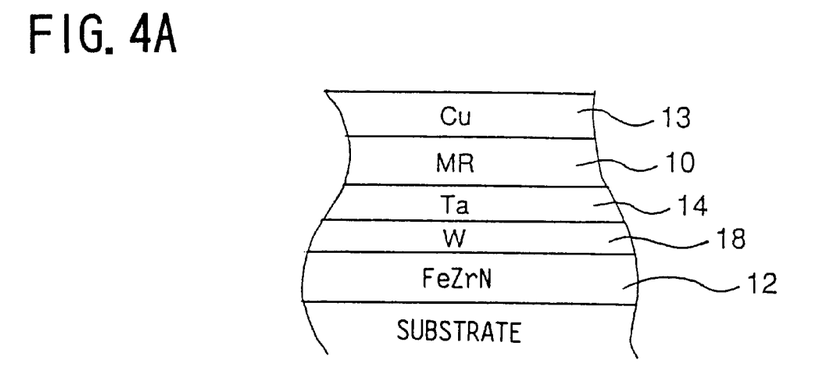
FIGS. 4A to 4F are illustrations for explaining a method of manufacturing the CPP type tin-film magnetic head shown in FIG. 3.

As shown in FIG. 4A, first, an FeZrN layer having a thickness of about 2 μm is deposited on a substrate by a sputtering method. The FeZrN layer corresponds to the lower shielding layer 12. A tungsten layer having a thickness of about 10 nm is formed on the FeZrN layer. The tungsten layer corresponds to the under layer 18. Additionally, a tantalum layer having a thickness of about 20 nm is formed on the tungsten layer. The tantalum layer corresponds to the lower gap layer 14. Thereafter, the GMR element 10 is formed on the tantalum layer. If a tunnel type GMR is used, a layered structure comprising NiFe (2 nm)/Co (1 nm)/ $Al_2O_3$ (5 nm)/Co (2 nm)/PdPtMn (20 nm) is formed on the tantalum layer by a sputtering method. A spin valve type GMR element can be formed in the same manner. Thereafter, a Cu layer having a thickness of about 3 nm is formed on the GMR element. The Cu layer corresponds to the upper gap layer 13. The above-mentioned layered structure can be formed by a continuous process or separate processes.

Figure 4B:
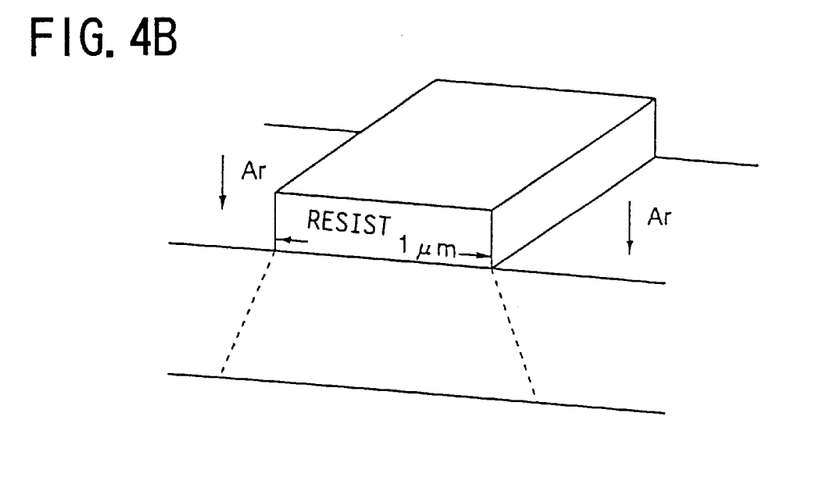
Figure 4C:
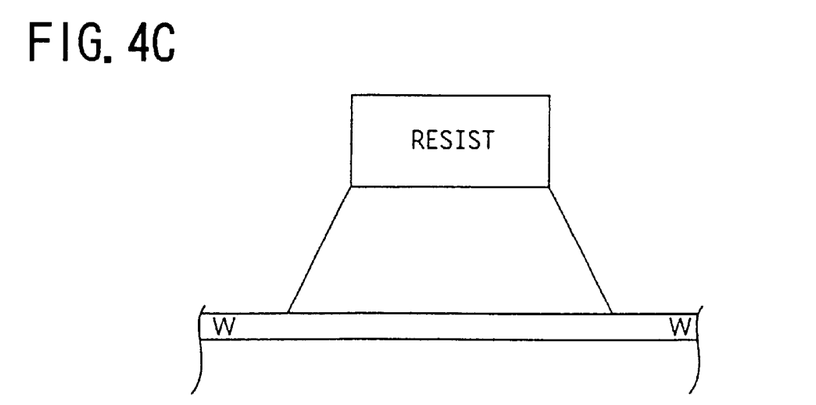

After the layered structure is formed as shown in FIG. 4A, a resist layer having a height of about 3 μm and a width of about 1 μm is formed on the Cu layer corresponding to the upper gap layer 13 as shown in FIG. 4B. Thereafter, dry etching using argon gas (Ar) is performed until the tungsten layer corresponding to the under layer 18 appears. Accordingly, as shown in FIG. 4C, the GMR element 10 and the tantalum layer are patterned to have a width of about 1 μm. The width of the GMR element 10 is determined by a width of a track formed on a recording medium from which data is read by the GMR element 10.

Figure 4D:
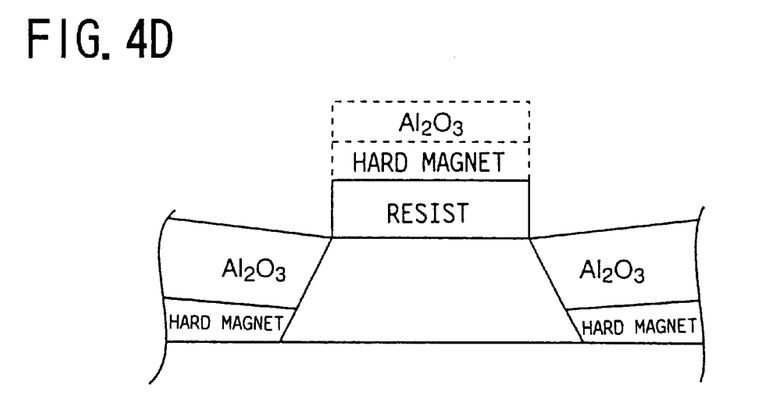

After the above-mentioned dry etching process is completed, a CoPt layer or a $CoFe_2O_3$ layer having a high insulation is formed by a sputtering method. The CoPt layer or the $CoFe_{2O3}$ layer corresponds to hard magnet layers 16A and 16B. Additionally, an alumina ($Al_2O_3$) layer is formed on the CoPt layer or the $CoFe_{2O3}$ layer. The alumina layer corresponds to the insulating layers 17A and 17B. It should be noted that the alumina layer effectively prevents a leak current even if the hard magnet layer formed from a Co material is present. The hard magnet layer formed from $CoFe_2O_4$ has a high resistivity and shows good insulating properties. Accordingly, in such a case, insulation is further improved, and, thereby, an yield rate is increased and productivity is increased.

Figure 4E:
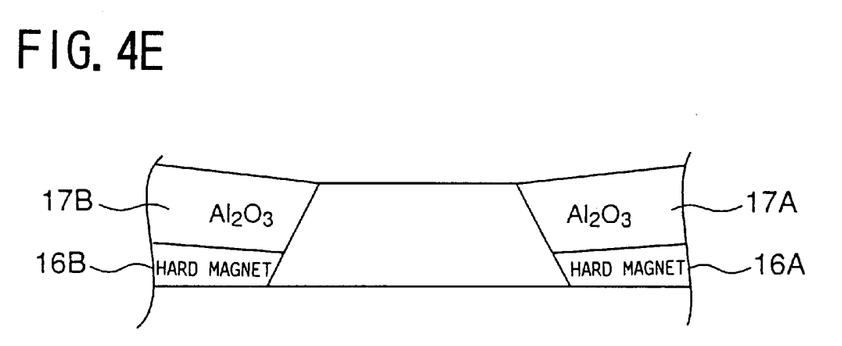

Thereafter, the resist layer is removed so as to remove the hard magnet layer and the alumina layer formed on the resist layer. Accordingly, as shown in FIG. 4E, the hard magnet layers 16A and 16B and the insulating layers' 17A and 17B are formed on the right side and the left side of the GMR element 10, respectively.

Figure 4F:
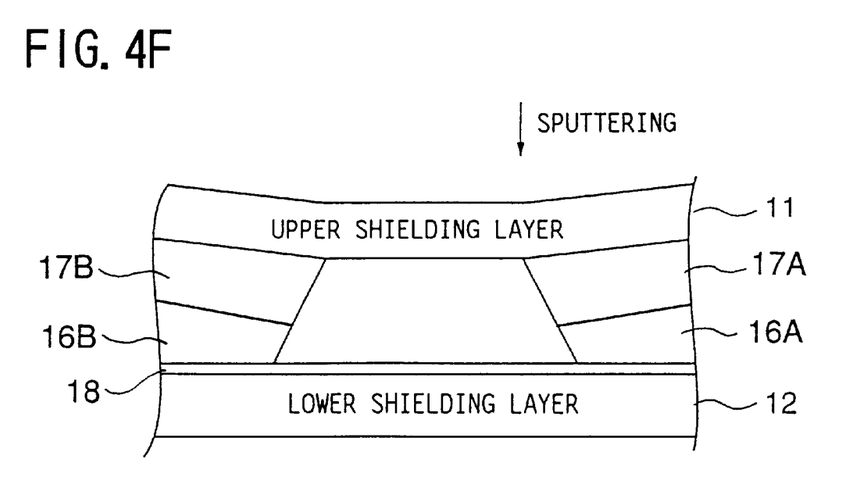

Thereafter, an FeZrN layer corresponding to the upper shielding layer 11 is formed on the insulating layers 17A and 17B and the upper gap layer 13 by a sputtering method as shown in FIG. 4F. Thereby, the structure of the thin-film magnetic head shown in FIG. 3 is formed.

Figure 5:
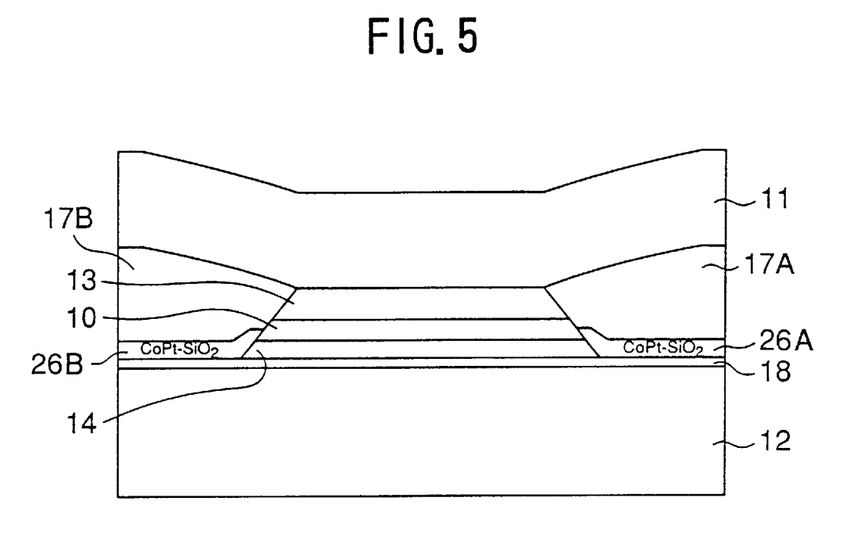
FIG. 5 is a CPP type thin-film magnetic head according to a second embodiment of the present invention.

A description will now be given, with reference to FIG. 5, of a second embodiment of the present invention. FIG. 5 is an illustration of a thin-film magnetic head according to the second embodiment of the present invention. In FIG. 5, parts that are the same as the parts shown in FIG. 3 are given the same reference numerals, and descriptions thereof will be omitted.

As shown in FIG. 5, the thin-film magnetic head according to the second embodiment of the present invention has the same structure as the thin-film magnetic head according to the first embodiment except for the hard magnet layers 16A and 16B being replaced by hard magnet layers 26A and 26B, respectively. Each of the hard magnet layers 26A and 26B is formed from a material which has good insulating properties and is capable of having a soft magnet layer provided in the GMR element 10 to be in a single domain state. The good insulating properties greatly reduces a leak current. The single domain structure of the soft magnetic material provided in the GMR element 10 reduces generation of a Balkhausen noise. Such a material used for the hard magnet layers 26A and 26B preferably has a large magnetic anisotropy, a large coercive force Hc and a large residual magnetization Br. In the present embodiment, each of the hard magnet layers 26A and 26B is formed from $CoPt-SiO_2$. The hard magnet layers formed from $CoFe_2O_4$ has a residual magnetization of about 2,000 G which is a preferable value. The hard magnet layers of $CoPtSiO_2$ has a residual magnetization of about 4,000 G which results in establishment of a further effective single domain state of the soft magnet layer of the GMR element 10. It should be noted that a ferrite based material represented by $MFe_2O_4$ having high insulation properties may be used as the material of the hard magnet layers 26A and 26B, where M represents a divalent metal. Alternatively, $\gamma\text{-}Fe_2O_3$ ($\gamma$-iron) may be used as the material of the hard magnet layers 26A and 26B.

Figure 6:
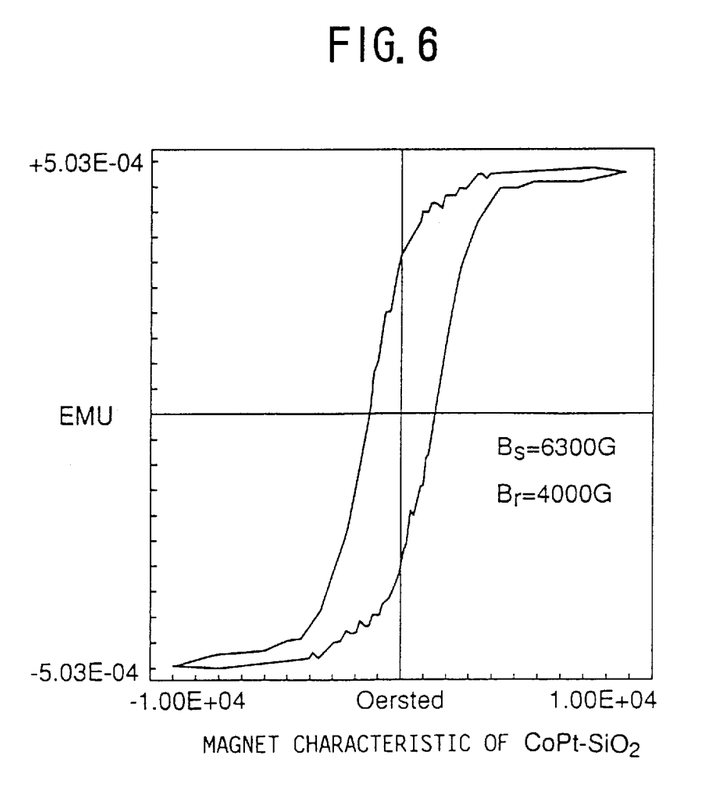
FIG. 6 is a graph showing a magnetic characteristic of a hard magnet layer provided in the CPP type thin-film magnetic head shown in FIG. 5.

FIG. 6 is a graph showing a magnetic characteristic of a $CoPt-SiO_2$ layer used as the hard magnet layers 26A and 26B. In the graph of FIG. 6, the horizontal axis represents an intensity of a magnetic field applied to the $CoPt-SiO_2$ layer, and the vertical axis represents a magnitude of magnetization.

It should be noted that, in the above-mentioned embodiments, the tantalum layer is formed on the tungsten layer having a body-centered cubic structure and the MR element is positioned on the tantalum layer so as to increase the sensitivity of the MR element while the hard magnet layers are provided on the tantalum layer so as to reduce a Balkhausen noise. However, the hard magnet layers of a Co based material may be directly formed on the tungsten layer without forming the tantalum layer so as to merely reduce a Balkhausen noise.

Additionally, the present invention may be applied to a recording and reproducing head by providing a conventional thin-film inductive head to the thin-film magnetic head according to one of the above-mentioned embodiments.

The present invention is not limited to the specifically disclosed embodiments, and variations and modifications may be made without departing from the scope of the present invention.

The present application is based on Japanese priority application No. 11-29236 filed on Feb. 5, 1999, the entire contents of which are hereby incorporated by reference.

What is claimed is:

1. A current perpendicular type magnetoresistive device having a magnetoresistive element in which a current flows through the magnetoresistive element in a direction perpendicular to a plane of the magnetoresistive element, said magnetoresistive device comprising:

upper and lower shielding layers forming a gap therebetween so that said magnetoresistive element is situated within said gap;

upper and lower gap layers provided within said gap so that said magnetoresistive element is interposed between said upper and lower gap layers, said upper gap layer being provided between said upper shielding layer and said magnetoresistive element, said lower gap layer being provided between said lower shielding layer and said magnetoresistive element, said lower gap layer being formed from tantalum; and an under layer interposed between said lower shielding layer and said lower gap layer, said under layer being formed from a material having a body-centered cubic structure.

2. The current perpendicular type magnetoresistive device as claimed in claim 1, wherein said material having a body-centered cubic structure is a metal selected from a group consisting of tungsten, titanium, chrome, iron, lithium, vanadium and molybdenum or an alloy of a metal selected from said group.

3. The current perpendicular type magnetoresistive device as claimed in claim 1, wherein said upper gap layer is formed from a metal selected from a group consisting of copper, gold, tungsten, ruthenium, platinum, palladium and tantalum or an alloy of a metal selected from said group.

4. A current perpendicular type magnetoresistive device having a magnetoresistive element in which a current flows through the magnetoresistive element in a direction perpendicular to a plane of the magnetoresistive element, said magnetoresistive device comprising:

upper and lower shielding layers forming a gap therebetween so that said magnetoresistive element is situated within said gap;

upper and lower gap layers provided within said gap so that said magnetoresistive element is interposed between said upper and lower gap layers, said upper gap layer being provided between said upper shielding layer and said magnetoresistive element, said lower gap layer being provided between said lower shielding layer and said magnetoresistive element; and an under layer interposed between said lower shielding layer and said lower gap layer, said under layer being formed from a material having a body-centered cubic structure, wherein said magnetoresistive element has a predetermined width, and an insulating member is provided on each side of said magnetoresistive element so that said insulating member covers each side of said magnetoresistive element and said insulating member spans from said upper shielding layer to said under layer, and wherein said insulating member includes an insulating layer and a hard magnet layer having hard magnetic properties so that said hard magnet layer is interposed between said insulating layer and said under layer.

5. The current perpendicular type magnetoresistive device as claimed in claim 4, wherein said hard magnet layer is formed from a cobalt based alloy.

6. The current perpendicular type magnetoresistive device as claimed in claim 5, wherein said hard magnet layer is formed from $CoPt-siO_2$.

7. The current perpendicular type magnetoresistive device as claimed in claim 4, wherein said hard magnet layer is formed from a ferrite based alloy represented by $MFe_2O_4$, where M is a divalent metal.

8. The current perpendicular type magnetoresistive device as claimed in claim 7, wherein said hard magnet layer is formed from $CoFe_2O_4$.

9. The current perpendicular type magnetoresistive device as claimed in claim 4, wherein said hard magnet layer is formed from $\gamma\text{-}Fe_2O_3$.

10. The current perpendicular type magnetoresistive device as claimed in claim 4, wherein said material having a body-centered cubic structure is a metal selected from a group consisting of tungsten, titanium, chrome, iron, lithium, vanadium and molybdenum or an alloy of a metal selected from said group.

11. The current perpendicular type magnetoresistive device as claimed in claim 4, wherein said upper gap layer is formed from a metal selected from a group consisting of copper, gold, tungsten, ruthenium, platinum, palladium and tantalum or an alloy of a metal selected from said group.

12. The current perpendicular type magnetoresistive device as claimed in claim 4, wherein said magnetoresistive element is one of a tunnel type giant magnetoresistive element and a spin valve type giant magnetoresistive element.

13. The current perpendicular type magnetoresistive device as claimed in claim 1, wherein said magnetoresistive element is one of a tunnel type giant magnetoresistive element and a spin valve type giant magnetoresistive element.

* * * * *

UNITED STATES PATENT AND TRADEMARK OFFICE
CERTIFICATE OF CORRECTION

PATENT NO. : 6,249,407 B1
DATED : June 19, 2001
INVENTOR(S) : Aoshima et al.

It is certified that error appears in the above-identified patent and that said Letters Patent is hereby corrected as shown below:

Column 8,
Line 56, delete "siO$_2$" and insert -- SiO$_2$ -- therefor.

Signed and Sealed this

Fifth Day of March, 2002

Attest:

JAMES E. ROGAN
Attesting Officer  Director of the United States Patent and Trademark Office